US008751914B2

(12) United States Patent
Papagiannis

(10) Patent No.: US 8,751,914 B2
(45) Date of Patent: Jun. 10, 2014

(54) ENCODING METHOD OF TLDPC CODES UTILIZING TREILLIS REPRESENTATIONS OF THE PARITY CHECK EQUATIONS AND ASSOCIATED ENCODING DEVICE

(75) Inventor: Evangelos Papagiannis, Larisa (GR)

(73) Assignee: Orange, Paris (FR)

( * ) Notice: Subject to any disclaimer, the term of this patent is extended or adjusted under 35 U.S.C. 154(b) by 1034 days.

(21) Appl. No.: 12/677,881

(22) PCT Filed: Sep. 15, 2008

(86) PCT No.: PCT/IB2008/055613

§ 371 (c)(1),
(2), (4) Date: Jun. 25, 2010

(87) PCT Pub. No.: WO2009/034561

PCT Pub. Date: Mar. 19, 2009

(65) Prior Publication Data

US 2010/0287439 A1 Nov. 11, 2010

(30) Foreign Application Priority Data

Sep. 14, 2007 (EP) ..................................... 07301370

(51) Int. Cl.
*H03M 13/25* (2006.01)

(52) U.S. Cl.
USPC ............ 714/792; 714/746; 714/752; 714/786

(58) Field of Classification Search
USPC .................. 714/786, 927, 746, 752, 792, 796
See application file for complete search history.

(56) References Cited

U.S. PATENT DOCUMENTS

| | | | | |
|---|---|---|---|---|
| 7,392,455 | B2 * | 6/2008 | Cadic et al. | 714/755 |
| 7,689,896 | B2 * | 3/2010 | Motwani | 714/792 |
| 7,752,528 | B2 * | 7/2010 | Park et al. | 714/784 |
| 7,836,384 | B2 * | 11/2010 | Tillich et al. | 714/790 |
| 8,196,005 | B2 * | 6/2012 | Kienle et al. | 714/755 |

FOREIGN PATENT DOCUMENTS

| | | |
|---|---|---|
| EP | 1 471 647 A2 | 10/2004 |
| WO | WO 2006/000666 A1 | 1/2006 |

OTHER PUBLICATIONS

Andriyanova et al., "Asymptotically Good Codes with High Iterative Decoding Performances," Proc., IEEE Intenat. Symp. on Information Theory, ISIT 2005, Adelaide, Australia, pp. 850-854 (Sep. 4, 2005-Sep. 9, 2005).

(Continued)

*Primary Examiner* — Joseph Schell
(74) *Attorney, Agent, or Firm* — Drinker Biddle & Reath LLP

(57) ABSTRACT

Encoding method (1) and device associating p redundancy data bits with k information data bits to determine code words with a block length of n=p+k data bits. The code words are of tail-biting trellis low density parity check type. The method and the device implement a degree distribution profile of the n data bits defining a base code word including multiple replicas of the n data bits with respect to the degree distribution. This base code is represented by a two-states trellis formed of sections with positions accommodating data bits of the base code whereby the number of positions of a section is denoted as the degree of the section. The method and the device makes (2) a partition of the base code trellis into p intersecting regular parts of triple sections representing p parity check equations.

11 Claims, 11 Drawing Sheets

(56) References Cited

OTHER PUBLICATIONS

Andriyanova et al., "A new family of codes with high iterative decoding performances," Proc., IEEE Internat. Conf. on Communications, ICC'06, Istanbul, Turkey, pp. 1177-1182 (Jun. 11, 2006-Jun. 15, 2006).

Ohtsuki, "LDPC Codes in Communications and Broadcasting," IEICE Transactions on Communications, Communications Society, Tokyo, Japan, vol. E9OB (3), pp. 440-453 (Mar. 2007).

Ping et al., "Simple Erasure Correcting Codes with Capacity Achieving Performance," Proc., IEEE Internat. Conf. on Global Telecommunications, Globecom, 2002, Taipei, Taiwan, vol. 1, pp. 1047-1050 (Nov. 17, 2002-Nov. 21, 2002).

* cited by examiner

ENCODING METHOD OF TLDPC CODES UTILIZING TREILLIS REPRESENTATIONS OF THE PARITY CHECK EQUATIONS AND ASSOCIATED ENCODING DEVICE

CROSS-REFERENCE TO RELATED APPLICATIONS

This application is the U.S. national phase of the International Patent Application No. PCT/IB2008/055613 filed Sep. 15, 2008, which claims the benefit of European Patent Application No. 07301370.8 filed Sep. 14, 2007, the entire content of which is incorporated herein by reference.

FIELD OF THE INVENTION

The field of the invention is that of digital communications. More specifically, the invention relates to error correcting codes. The invention relates in particular, but not exclusively, to the codes known as "LDPC, Low Density Parity Check".

The invention can apply to all areas where an error correcting code is necessary, or at least desirable. Thus, the invention can, for example, be applied:

to the protection against errors due to the noises and interference inherent to the physical transmission channels (conventional error correcting coding and space-time codes for multiple-antenna systems);

to compressed signals obtained from information sources: images, sounds, signals, data;

to the protection against errors for storing data in mass memories, such as computer disks or microprocessors.

The invention can apply to different standardization communication protocols, such as IEEE 802.11n protocol adapted to very high flow wireless local area network, WLAN, and IEEE 802.16 protocol adapted to world wide interoperability microwave access, WIMAX.

BACKGROUND

Error correction coding, also known as channel coding is essentially the process of adding redundancy to the original data that is to be transmitted or stored, with primal goal to reduce the probability that errors may occur. A general communication system Sys can be represented as in FIG. 1 where the transmitter Tra sends data over a noisy channel Ch and the receiver Rec has the task to identify the transmitted stream. The presence of noise within the channel perturbs the transmitted signal and generates errors. One way to guarantee the reliability of the receiver's decisions is to increase the transmitted signal power, or in other words to increase the ratio of the signal over the noise power. Another way is to minimise the rate of transmission, i.e. to minimise the bandwidth and consequently the noise. However, any of these approaches would set a barrier to the practical use of wireless communications. The work of Shannon in early '40s showed that it is possible to communicate reliably at rates very close to the capacity limits of a given channel, as long as error correction coding is used. So, application of error correction coding offers the potential for low power, high data rate reliable communications.

In addition to the k information data (which may be symbols depending of the system), p additional data are transmitted. Those p additional data, known as redundancy data, are chosen by the encoder Enc in such a way that for the particular k data, some well known rules are satisfied. The k+p data are then transmitted and the decoder Dec that is aware of the encoding rules, checks if they are satisfied. If yes, the received data is correct. If not, it means that one or more of the k information data have been received in error. Based on the same rules, the decoder must then decide which are the most probable values for the k transmitted data.

In a practical communication system binary symbols called bits 1 and 0 are used. The rules are now a set of parity check equations that should be equal to zero under modulo-2 arithmetic's. The structure of the code defines which bits participate in which equation. A sequence v is considered as a codeword when:

$$Hv^T=0 \qquad (1)$$

The p rows of the parity check matrix H of a code defines the set of the p parity check equations. An entry of 1 in the position $h_{ij}$ of the parity check matrix means that the code bit with index j participates in the $i^{th}$ parity check equation.

The H matrix can be seen as a system of equations where modulo-2 arithmetic's apply and parity bits are the unknowns. Encoding is equivalent to solving this system and finding its unique solution (the parity bits values). This is done by pure calculus techniques like the Gaussian elimination method.

The known Gaussian elimination technique may be used to bring the H matrix in encodable form, i.e. a triangular form. Unfortunately, the process of triangulation becomes highly complex even for code lengths of low to moderate size. Gaussian elimination does not guarantee success at once and very often the resulted matrix may not be full rank and have the form of FIG. 2 where g is the "gap" parameter which is a kind of measure of the "distance" of the parity check matrix to a triangular matrix. In the case where after the Gaussian elimination operation the gap is larger than zero, the only solution is to swap columns in the original H matrix and re-apply Gaussian elimination. It can be concluded that, even for a moderate size code, the number of available column swap combinations is huge.

Consequently, triangulation of the H matrix might prove to be a lengthy and complex task. T. J. Richardson and R. L. Urbanke in the article "Efficient encoding of low-density parity-check codes", IEEE Transactions on Information theory, Vol. 47, No. 2, pages 638-656, February 2001, propose various versions of the "Greedy algorithms" to ensure that the approximate lower triangular at the beginning of the algorithm has minimum gap.

Numerous coding families have been proposed since Shannon theory of information.

Thus known are the convolutional codes (which can, in particular, implement trellis coding systems, according to the Viterbi algorithm), or even the coding scheme routinely called "turbo-code", proposed in 1993 by C. Berrou and A. Glavieux, for example in the article "Near Shannon Limit Error-Correcting Coding and Decoding: Turbo-Codes" (proof readings of the ICC'93, May 1993, p 1064 to 1070). This technique has been the subject of numerous studies and improvements.

Also known is the family of codes known as the LDPC ("Low-Density Parity Check") codes invented by Gallager in 1960, generalised by Tanner in 1981 and rediscovered in 1995. LDPC codes are defined by a parity check matrix H that is sparse, i.e. comprises very few 1s and many 0s for binary codes. In case of binary codes, the data are generally designated by the term bits and in place of redundancy data the terms parity bits are generally used.

The turbo-codes and LDPC codes, and, more generally, all concatenated codes, offer performance levels in correction terms that are remarkable, for large block sizes, in particular for blocks of at least a few thousand or tens of thousands of information data (which may be bits depending of the system).

Unfortunately, manipulating such blocks of information data involves highly complex computation in decoding, which in practice turns out to be compatible only with microprocessors with considerable computing capability which are consequently relatively costly.

Furthermore, these structures are not powerful in error correcting terms for small-size blocks, for example blocks of around a hundred or a thousand data.

Although efficient and sophisticated, the triangulation method is still complex for TLDPC encoding. Moreover, this method has major drawbacks.

First, it necessitates storing the H parity check matrix in order to perform encoding. This evolves memory requirement whose size and cost increase with block-length codes.

Second, because of Gaussian elimination it tends to increase density of the H parity check matrix, in other words the number of 1's relative to the size of the matrix. A dense matrix has many 1's, hence many bits participating on the parity checks. That means that the encoder would require a large number of connections and logic gates. That would add up to the cost, to the chip area utilisation and to the power consumption of the chip. Additionally, the increased density of the matrix would contribute to increase the memory requirement, as only the non-zero positions of the matrix are stored.

TLDPC (Trellis Low Density Parity Check) codes were introduced by I. Andriyanova, J. P. Tillich and J. C. Carlach in the article "Asymptotically good codes with high iterative decoding performances", ISIT'05, pages 850-854, IEEE September 2005 as a new family of asymptotically good LDPC codes that combine low complexity decoding and superior performance. The construction starts with a binary code of length m called the base code and yields a code of smaller length n with the help of degree distribution $\Lambda=(\lambda_1, \lambda_2, K, \lambda_s)$ over the set of integers $\{1, 2, K, s\}$ so that $\lambda_i \times n$ is an integer for any $i \in \{1, 2, K, s\}$ and such that $n\Sigma_{i=1}^{s} i\lambda_i = m$. Initially, the construction creates a bipartite graph between two sets U and W of length n and m respectively. The set U represents the actual code under construction while the set W represents the base code. A node in the graph represents a bit. The degree of any vertex in W is exactly one and the number of vertexes in U of degree i is $\lambda_i \times n$. In other words, the base code set W includes multiple replicas of the vertexes of U with respect to the chosen degree distribution $\Lambda(x)$. A vertex in U is linked with $\lambda_i$ vertexes of W. $\Lambda(x)$ expresses the degree distribution in a compact polynomial form:

$$\Lambda(x)=a_0+a_1x+a_2x^2+K+a_nx^n \qquad (2)$$

The power of the element $x^i$ denotes degree i+1 and the constants $a_i$, the percentage of the total edges that belong to a node of the denoted degree. As an example $\Lambda(x)=0.7x+0.3x^{11}$ means that 70% of the edges belong to nodes of degree two and 30% to nodes of degree twelve. Similarly, $\Lambda(x)=x$ denotes that all nodes have degree two. FIG. 3 shows the bipartite graph of a code of block length n=10 and degree distribution profile $\Lambda(x)=x$.

One of the main advantages of TLDPC codes is the low complexity decoding which is a result of the very simple two-state trellis representation of these codes. A two-state trellis is a two level trellis. Thus a transition from one node to another will either point towards the same level or to the other one.

The base code bits are arranged along the trellis with respect to the rules that have been described in the previous article and in a second article of the same authors "A new family of asymptotically good codes with high iterative decoding performances", ICC'06, June 2006. These rules give indications to avoid designing bad codes (with very low minimum distance). There are several families of TLDPC codes, each differing on the number of bits that are accommodated on each trellis section. The trellis diagram of the code derived from the bipartite graph of FIG. 3 is shown in FIG. 4. The different families disclose in the previous article "A new family of asymptotically good codes with high iterative decoding performances", ICC'06, pages 1177 to 1182, June 2006 are called respectively A, B, C, D and E.

The trellis of the Family-A TLDPC codes with bits of degree-one is defined as follows: there are r sections with indexes $i=\{0, 1, K, r-1\}$. Those sections i where i(mod 3)=0, carry one bit. In other words they are degree-one sections. All remaining sections carry two bits. The number of degree-one sections is identical with the number of degree-one bits. The generated codes have rate 0.5.

Family-E TLDPC codes trellis structure differs from family-A structure in the number and position of degree-one sections along the trellis. Since the number of degree-one sections is identical with the number of degree-one bits, this changes too. There are r trellis sections with indexes $i=\{0, 1, K, r-1\}$. All sections carry two bits except of those sections whose index i satisfies i(mod 5)=0 which carry one bit.

Family-C TLDPC codes have more sections and bits of degree-one than family-E, but less than family-A. From the r sections of the trellis with index $i=\{0, 1, K, r-1\}$ only those sections with index such that i(mod 4)=0 are degree-one sections. The trellis permutation is constructed exactly as in families A and E.

The trellis of TLDPC codes exhibits two major characteristics, namely:

transition from current state t to the following state t+1 is not associated with a unique path, the values of the current state and the input bit are not sufficient for determining the next state.

An outcome of these two statements is that an input sequence starting from a fixed state can be represented in the trellis by multiple paths. To state it in a different way, a certain path in the trellis is not associated with a unique base codeword. Consequently, attempting to encode by tracking down the candidate paths on the trellis is a very difficult task even for very short codes because the number of candidate paths grows rapidly. Furthermore there's no certainty that there will be a path on the base code trellis that will yield a valid codeword of length n, i.e. a path along which all multiple replicas of an actual code bit are identical.

The following example helps describing this problem. The task is to encode the code that is derived from the bipartite graph of FIG. 3 and yields the base code trellis of FIG. 4. The degree distribution is $\Lambda(x)=x$, which means that all bits have degree two. The length n of the code is ten of which five are information bits and five parity bits. The bits $u_i$ with indexes from five to nine are considered as information bits; hence the information to be sent is accommodated to these bits. The remaining bits $u_i$ with indexes from zero to four are the parity bits. The encoding process has to encode the message $\{u_5u_6u_7u_8u_9\}=\{01101\}$. After substituting the information bits values on the base code trellis, the trellis becomes as in FIG. 5. Given the values and the position of the information bits, some of the paths cannot exist and are removed from the trellis. However, there are still many available paths and for encoding to be successful there must be found a path that satisfies all $u_i$ pairs. Clearly, even for such a short code the complexity of the encoding procedure is high and increases exponentially with the block-length. Moreover, it is not guaranteed that a code exists for a certain permutation that means for the chosen arrangement of the bits along the base code trellis.

SUMMARY

The invention is designed to overcome drawbacks of the prior art.

More specifically, it is therefore an object of the invention to provide an encoding method and device which decrease memory requirement.

For this purpose, the encoding method associates p redundancy data bits with k information data bits to determine code words with a block length of n=p+k data bits, the code words being of tail-biting trellis low density parity check type. The method implements a degree distribution profile of the n data bits defining a base code word including multiple replicas of the n data bits with respect to the degree distribution, the base code being represented by a two-states trellis formed of sections with positions accommodating data bits of the base code whereby the number of positions of a section is denoted as the degree of the section. The method includes the steps of:

making a partition of the base code trellis into p intersecting regular parts of triple sections representing p parity check equations, arranging the base code data bits into the positions along the two-states trellis respecting the degree of the sections and of the data bits as well as pre-determined permutation rules, recovering successively the values of all unknown redundancy data bits, one regular part of triple section after the other, using a redundancy data bit value as a known value after being recovered from previous regular parts of triple sections.

And the encoding device comprises calculation means for encoding codes according to the encoding method.

At the beginning of the encoding, the redundancy data bits are considered as erasures. The only known data bits are the information data bits. Then part after part, the erasures are resolved and the redundancy data bits recovered by using the single-error correction capability of parity check equations. Once a redundancy data bit value is recovered, it is used as a known data bit value at later stage for resolving another erasure.

The method is very advantageously because there isn't any more H matrix to be memorized which drops memory requirement. Consequently, the encoding method eliminates need for pre processing relatives to H matrix triangulation process and eliminates high connectivity due to the dense parity check matrix. Moreover, memory requirement dropping decreases encoder's chip silicon area.

Another object of the present invention is to provide an encoding method and device which decrease complexity of coding and allow easy encoding.

For this purpose, the pre-determined permutation rules are, in a first embodiment, the following:

all degree one sections of the trellis are filled with redundancy data bits with respect that there's a remaining unfilled degree one section and this section can not be any of the first or the last two degree one sections of the trellis, the previous remaining unfilled degree one section is filled with a degree two redundancy data bit value, all sections of degree two or more are filled with data bits of degree two or more except of a single position at the last degree two section that is filled with the remaining degree one data bit value, each of the n-k trellis triple sections that represent parity check equations involve just one unknown data bit value, if the first copy of a redundancy data bit value of degree higher than one is placed on the trellis section i where i(mod 2)=0, then its replica(s) is placed on trellis section(s) j>I, otherwise if i(mod 2)=1 then the replica(s) is placed at trellis section(s) j>(i+1).

Advantageously, time and power consuming calculations are decreased because using very simple pre-determined permutation rules which allow very quick encoding.

Further, these very simple pre-determined permutation rules allow very easy implementation of encoding.

Advantageously, the encoding method complexity increases linearly with the block length of the code thus making it very attractive even for codes of many thousands of bits long.

Moreover the very low complexity of the encoding allows to decrease the computational load and thus to increase computational load capacity for other calculations.

An increase in performance in terms of less complexity, less memory requirement, less power consumption, less silicon area used may result especially in:

increasing the quality of service provided to the user;

improved range of base stations;

less noisy data transmission;

higher maximum information throughput rate available;

greater number of simultaneous users in a same zone covered by a base station.

Advantageously, the encoding method respect permutation rules determine in both Andriyanova's articles. Since these rules just avoid designing bad codes, the obtained codes according to the invention are good codes, which means with high minimum distance.

An implementation of an embodiment of the invention is a computer program on or in an information medium. The program can be in any programming language and in the form of source code, object code or an intermediate code between source and object code, such as in a partially compiled form, or in any other form desirable for implementing a method according to the invention.

BRIEF DESCRIPTION OF THE DRAWINGS

Preferred embodiments of the present invention will now be described, by way of example only, with reference to the accompanying drawings in which.

DETAILED DESCRIPTION

An encoding method, according to the invention, allows easily association of p redundancy data with k information data to determine code words with a block length of n=p+k data. The code words are of tail-biting trellis low density parity check type. The data correspond to binary bits in the following preferred embodiments.

Figure 6:
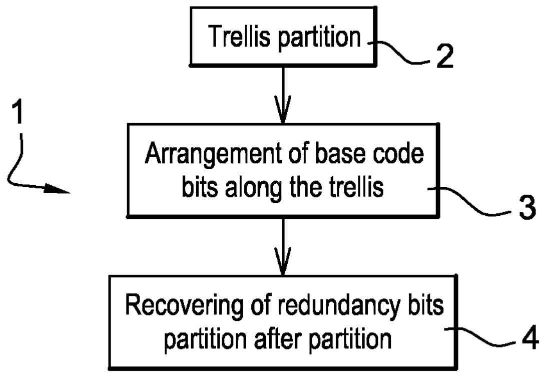
FIG. 6 is a flow chart of a first embodiment of an encoding method according to the invention.

A first preferred embodiment is described in relation with FIG. 6.

The encoding method 1 makes 2 a partition of the base code trellis into p=n−k (where k is the length of the information message) intersecting regular parts (triple sections) representing parity check equations. Bits with unknown values are called erasures.

Figure 7:
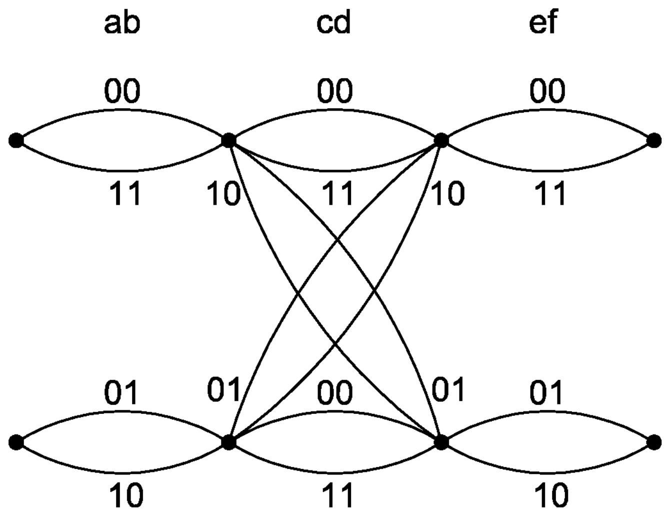
FIG. 7 is a part of a base code trellis after partitioning such that for all available paths the modulo-two sum of the involved bits is zero

FIG. 7 shows a part of the base code trellis after partitioning in such a way that for all available paths the modulo-two sum of the involved bits is zero. This is equivalent to a parity check equation.

Figure 8:
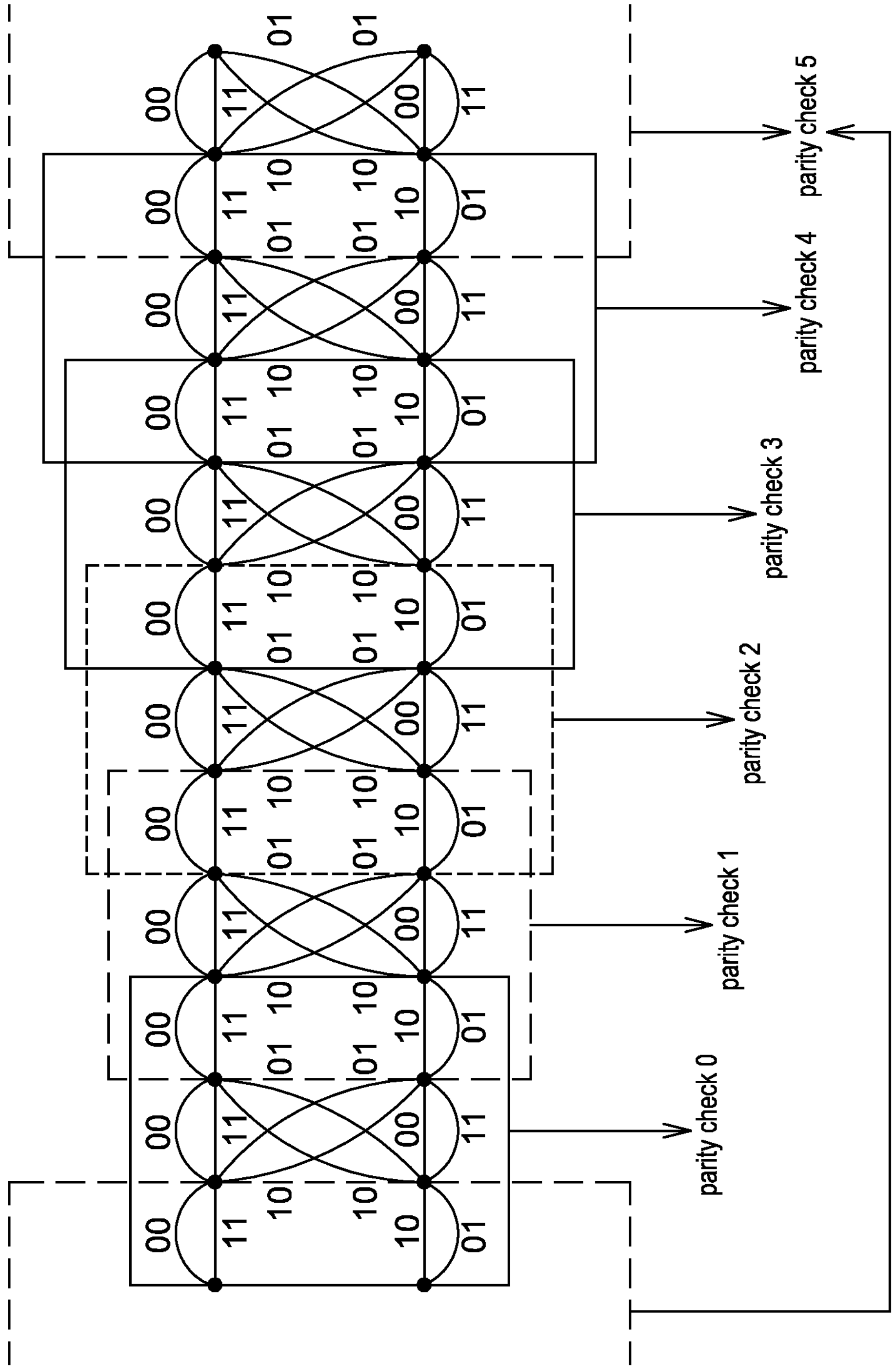
FIG. 8 is the partition into m/4=p parts of a base code trellis of length m.

FIG. 8 illustrates the partition into m/4=p parts of a base code trellis of length m, each part representing parity check equation.

Hence, an encoding method according to the invention, arranges 3 the bits into the positions along the base code trellis respecting the degree of the sections and of the bits as well as pre-determined permutation rules.

In a first embodiment, the arrangement is in such a way that not two erasures coincide within the same parity check equation. Consequently, each redundancy bit is successively recovered with the use of a parity check equation.

In a second embodiment, the tail-biting termination of the trellis is used to transform the last parity check equation using its modulo-two addition property into a new equation which is combined with the first parity check equation to start recovering unknown redundancy bits.

The method 1 recovers 4 successively the value of all unknown redundancy bits, partition after partition, using a redundancy bit as a known bit after being recovered from previous partitions. At the beginning of the algorithm the only known bits are the information bits and all parity bits are considered as erasures. After a parity bit value has been recovered, the bit becomes a known bit and stops being considered as an erasure.

Figure 9:
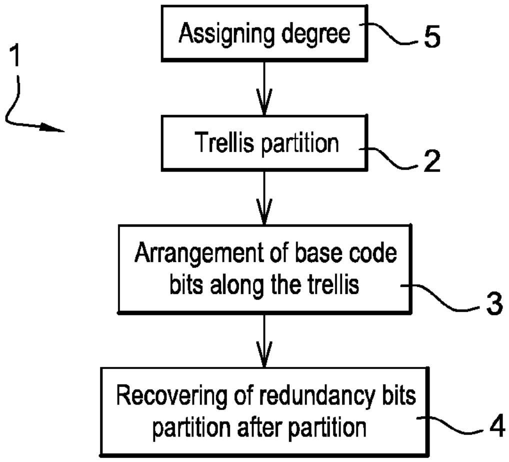
FIG. 9 is a flow chart of a second embodiment of an encoding method according to the invention.

FIG. 9 is a flow chart of a second embodiment of an encoding method according to the invention.

The steps 2-4 are identical to the steps already described in relation with FIG. 6 and then are not described again. Initially, according to this second embodiment, the encoding process assigns 5 successively the different degree of the distribution profile $\Lambda(x)$ of the n bits. Starting from the lowest degree, the method assigns the different degree first to the redundancy bits and then to the information bits.

Figure 10:
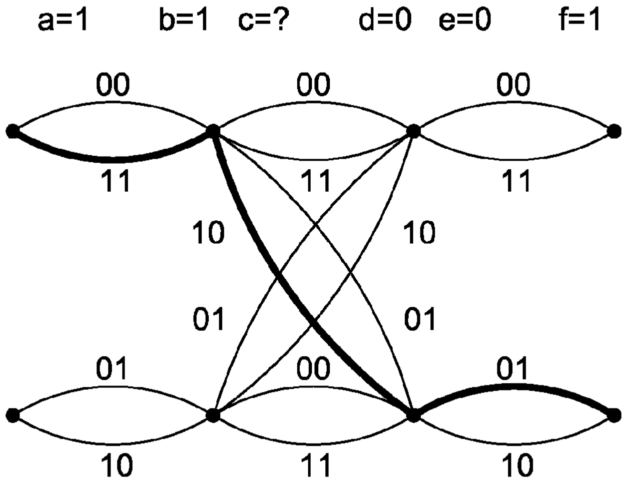
FIG. 10 is a part of a base code trellis after partition such that for all available paths the modulo-two sum of the involved bits is zero and after substitution of values of known data.

For example, consider the trellis representation of a parity check equation as this is shown in FIG. 7. Assume that only five out of the six participating bits are known while the value of a single bit is still missing. Then its value can be found by following the only possible path of the graph. This is equivalent with setting the value of the unknown bit equal to the modulo-two sum of the remaining five bits so that the modulo-two sum of all six participants is zero. The FIG. 10 shows the case where bit "c" is unknown. Given for instance that the values of "a, b, d, e" and "f" are "1, 1, 0, 0, 1" respectively, the only valid path satisfying these conditions is the one drawn with bold line and it associates "c" with the value "1". Any of the six bits can be treated as "c" in the above example. As long as only one bit is unknown the proper path can be found, or alternatively the parity check equation can be solved. If two unknowns exist then there are more than one candidate paths and equivalently more than one valid solution for the two unknowns.

Figure 11:
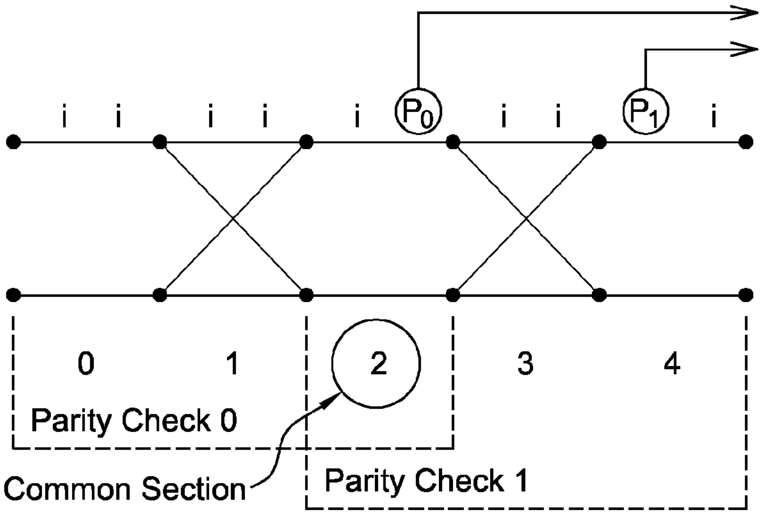
FIG. 11 is a diagram illustrating arrangement of information bits i of known values and of erasures (parity bits) $p_0$ and $p_1$ along a base code trellis.

Then, it is possible to recover gradually the values of all parity bits. In particular, a parity bit of degree i>1 (with more than one replica of itself along the trellis) that has been recovered at parity check equation q can be reused as a known bit this time at a later equation for recovering a new erasure. Considering a parity bit of degree one, as long as it is placed on even trellis sections (the even trellis sections are common between two successive parity checks), it is used as known bit after being recovered. FIG. 11 illustrates such an arrangement of information bits i of known values and of erasures (parity bits) $p_0$ and $p_1$. The parity bit $p_0$ is recovered from equation zero. The same bit $p_0$ is used as a known bit now for the recovery of $p_1$ from equation one. Both migrate to later sections to be used as known bits for the recovery of more erasures (parity bits).

Figure 1:
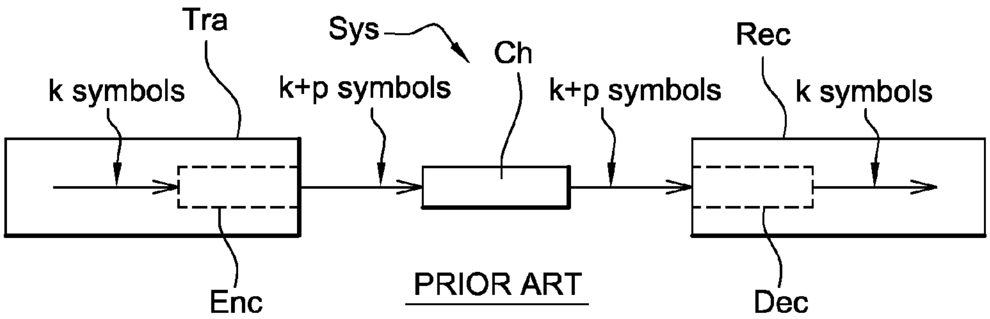
FIG. 1 is a block diagram of a communication system described in relation with prior art.
Figure 2:
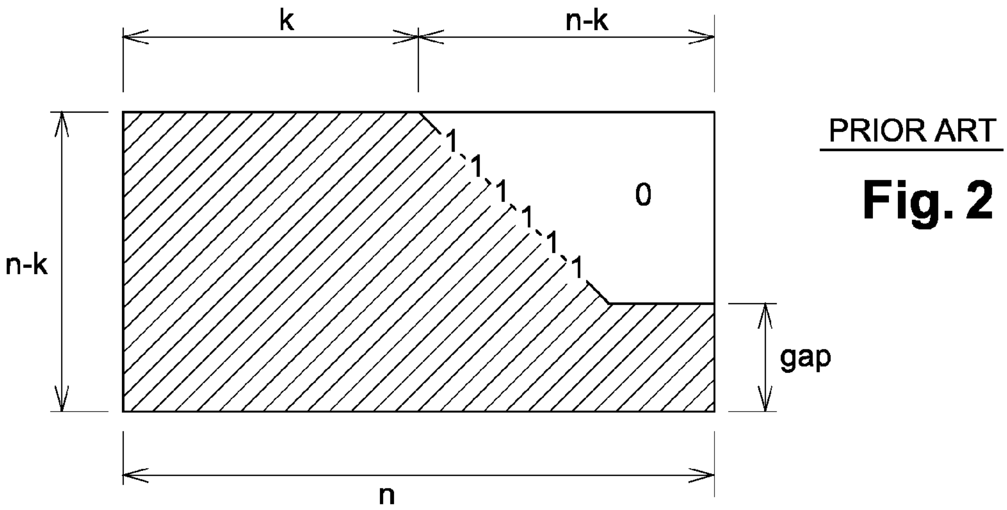
FIG. 2 is a diagram of a parity check matrix after Gaussian elimination in a triangulation process described in relation with prior art.
Figure 3:
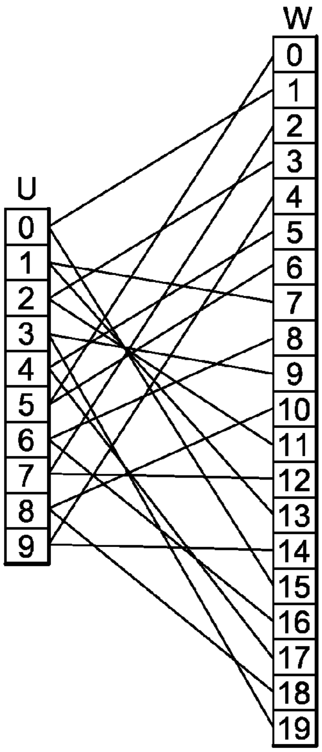
FIG. 3 is a bipartite graph of a family-A code of block length n=10 and with degree distribution profile $\Lambda(x)=x$ described in relation with prior art.
Figure 4:
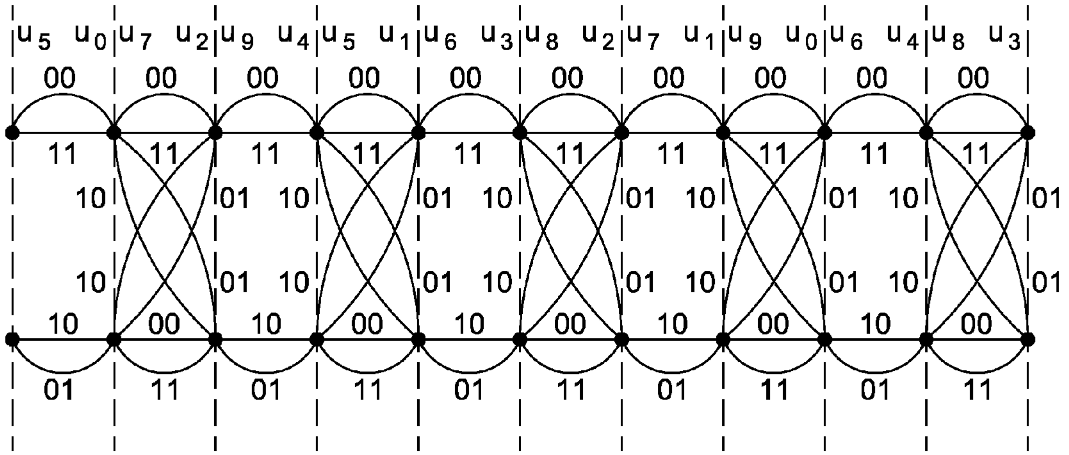
FIG. 4 is the base code trellis derived from the bipartite graph of FIG. 3 described in relation with prior art.
Figure 5:
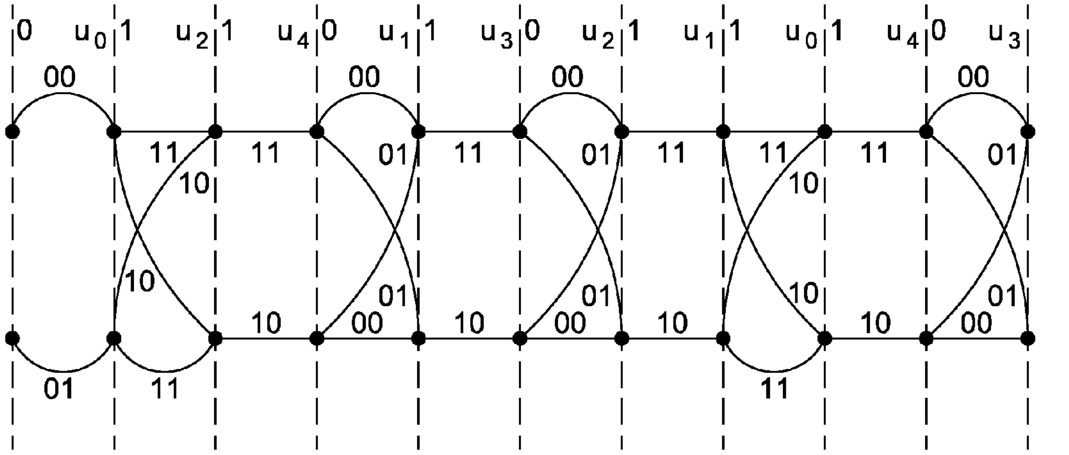
FIG. 5 is the base code trellis of FIG. 4 after substituting the information bits values on the base code trellis described in relation with prior art.

In a preferred embodiment, the encoding method encodes TLDPC code families with bits of degree one. The number of degree-one bits involved is denoted by $\lambda_1$. The number of degree-one bits $\lambda_1$ is equal to the number of degree-one trellis sections. The complexity of the scheme increases linearly with the block length of the code, thus it can be used quite effectively even for very long codes. The encoding method arranges the bits along the trellis (the choice of the permutation) with respect to pre-determined permutation rules so that linear encoding can be accomplished. These permutation rules for obtaining a linearly encodable code that involves $\lambda_1$ degree-one bits and $\lambda_1$ degree-one trellis sections are the following:

rule 1.1: All degree-one sections of the trellis (the sections that accommodate only one bit) are filled with parity bits rule 1.2: $(\lambda_1-1)$ degree-one sections of the trellis accommodates $(\lambda_1-1)$ degree-one bits. The remaining degree-one section is filled with a degree-two parity bit. This degree-one section has not to be any of the first or the last two degree-one sections of the trellis.

rule 1.3: All sections with degree greater than one are filled with bits of degree greater than one, except of a single position at the last degree-two section of the trellis that is filled with the remaining degree-one bit.

rule 1.4: Each of the n-k trellis triple-sections that represent parity check equations (FIGS. 5 and 8) involves just one unknown bit.

rule 1.5: If the first copy of a parity bit of degree higher than one is placed on the trellis section i where i(mod 2)=0, then its replica(s) must be placed on trellis section(s) j>i. If i(mod 2)=1 then the replica(s) must be placed at trellis section(s) j>(i+1).

An encoding method according to the invention is in detail described by way of the next examples.

First example is relative to family-A TLDPC codes with bits of degree-one. The trellis of such a code is defined as follows: there are r sections with indexes i={0, 1, . . . , r−1}. Those sections i where i(mod 3)=0, carry one bit. In other words they are degree-one sections. All remaining sections carry two bits. The generated codes have rate 0.5.

FIGS. 12-15 illustrate an example of constructing and encoding a family-A TLDPC code of block length n=24 and degree distribution profile Λ(x)=x.

Since the code rate is 0.5 there will be twelve parity bits, hence twelve parity checks. For Family-A codes, the number of trellis sections is twice the number of parity bits. Hence the trellis will have twenty-four sections, of which ten will be degree-one sections: the sections i=0; 3; 6 . . . where i(mod 3)=0 carry just one bit.

Figure 12:
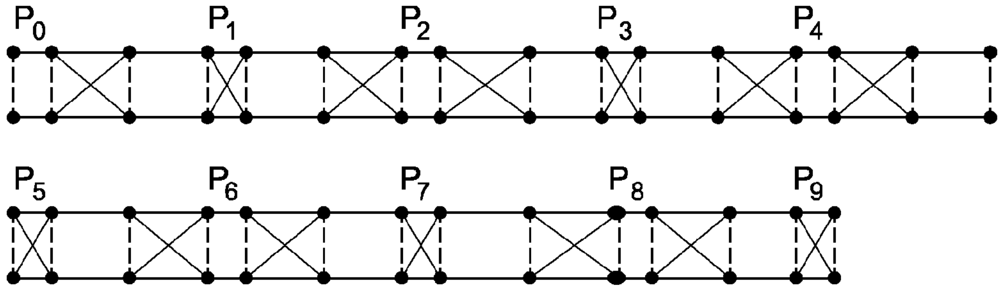
FIGS. 12-15 are complete base code trellis to illustrate an example of constructing and encoding a family-A TLDPC code with bit and section of degree-one and of block length n=24 and degree distribution profile $\Lambda(x)=x$.

The next step is to arrange on the trellis the parity bits and then the information bits. Due to rule 1.1 all degree-one sections carry parity bits, this is illustrated by FIG. 12. Due to rule 1.2 all but one of the parity bits that are accommodated at degree one sections, are degree one bits. The only non-degree one bit has in this case degree equal to two since the degree distribution polynomial Λ(x)=x dictates that all non degree one bits are of degree two. In the example the encoding process picks randomly $p_6$ among $p_2$; $p_3$; $p_4$; $p_5$; $p_6$; $p_7$ to be the only degree-two bit accommodated into a degree-one trellis section. The degree-one parity bits $p_0$; $p_1$; $p_8$; $p_9$ are out of question since they lie in the first two or the last two degree-one sections of the trellis (rule 1.2). The first copy of all parity bits has been placed along the trellis. $p_{10}$; $p_{11}$ and $p_{12}$ can equivalently be placed in any of the two neighbouring sections denoted by the small arrows without making any difference. From the ten degree-one parity bits, nine of them are already accommodated. From the 14−10=4 degree two parity bits only one is used. Following rule 1.3, the remaining degree one bit $p_{13}$ is placed at the last degree two section of the trellis as $p_{13}$ in FIG. 13. The first copies of the three remaining degree-two parity bits (the first copy of $p_6$ is already used) are placed on the trellis, in such a way that rule 1.4 is obeyed. From FIG. 13 it can be seen that only one unknown bit is associated with each parity check equation at any encoding instant. The replicas of the original copies of the degree-two parity bits are arranged along the trellis satisfying rule 1.5.

Figure 14:
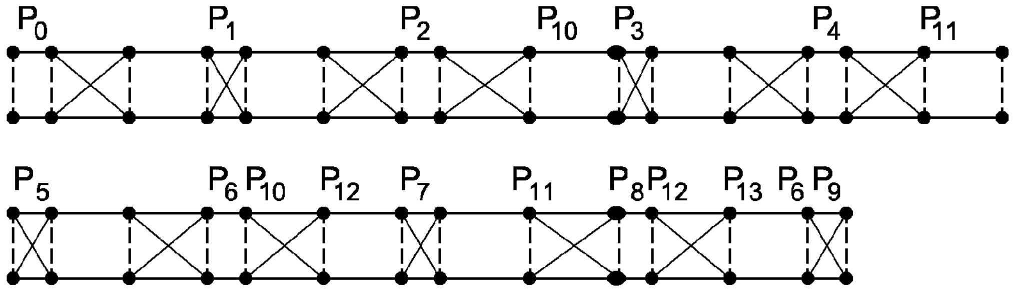

FIG. 14 shows the trellis after all the replicas of the parity bits have been placed along the trellis. Respect of the different rules ensures advantageously that:

(a) a parity bit has been recovered before being used as a known bit, (b) a parity bit while still unrecovered (unknown) does not participate twice in a parity check and thus cancelled out (due to modulo-2 rules).

Figure 15:
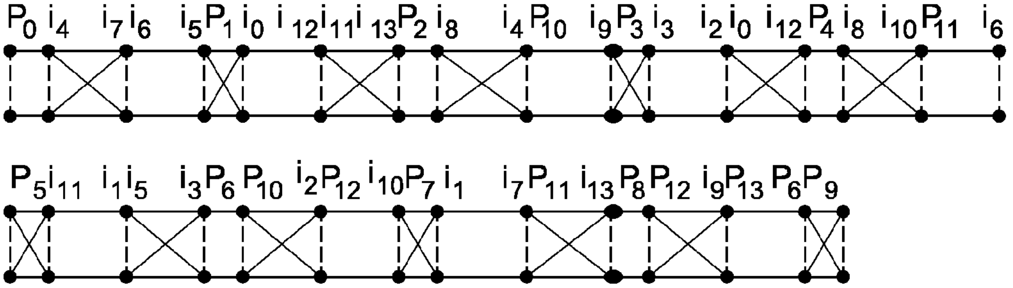

Finally the information bits are added along the trellis and the permutation is complete as in FIG. 15. Based on the trellis of FIG. 15 it is now easy to perform encoding.

Figure 13:
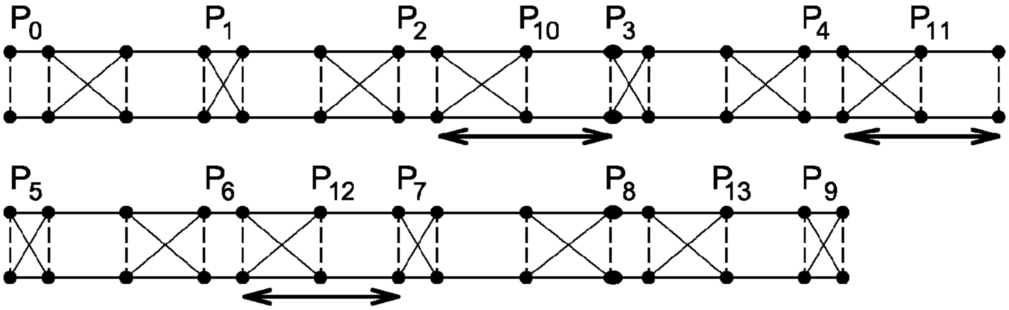

Next is an example of encoding a given information message $i=\{i_0=1, i_1=1, i_2=0, i_3=0, i_4=0, i_5=1, i_6=0, i_7=1, i_8=1, i_9=0, i_{11}=0, i_{12}=0, i_{13}=1\}$ with respect to the trellis permutation of FIG. 13. The encoding method starts with the first parity check equation which includes the bits $p_0$; $i_4$; $i_7$; $i_6$; $i_5$ whose expression is the following modulo2 equation:

$$p_0 \oplus i_4 \oplus i_7 \oplus i_6 \oplus i_5 = 0 \quad (3)$$

After substituting the values corresponding to the information bits, the expression of equation (3) becomes:

$$p_0 \oplus 0 \oplus 1 \oplus 0 \oplus 1 = 0 \quad (4)$$

The value of $p_0$ can be recovered from equation (4): $p_0=0$. The same procedure goes on with the second parity check equation for $p_1$.

$$p_1 \oplus i_0 \oplus i_{12} \oplus i_6 \oplus i_5 = 0 \rightarrow p_1 \oplus 1 \oplus 0 \oplus 0 \oplus 1 = 0 \rightarrow p_1 = 0 \quad (5)$$

The remaining parity bits are recovered similarly:

$$i_0 \oplus i_{12} \oplus i_{11} \oplus i_{13} \oplus p_2 = 0 \rightarrow 1 \oplus 0 \oplus 0 \oplus 1 \oplus p_2 = 0 \rightarrow p_2 = 0$$

$$p_2 \oplus i_8 \oplus i_4 \oplus p_{10} \oplus i_9 = 0 \rightarrow 0 \oplus 1 \oplus 0 \oplus p_{10} \oplus 0 = 0 \rightarrow p_{10} = 1$$

$$p_{10} \oplus i_9 \oplus p_3 \oplus i_3 \oplus i_2 = 0 \rightarrow 1 \oplus 0 \oplus p_3 \oplus 0 \oplus 0 = 0 \rightarrow p_3 = 1$$

$$i_3 \oplus i_2 \oplus i_0 \oplus i_{12} \oplus p_4 = 0 \rightarrow 0 \oplus 0 \oplus 1 \oplus 0 \oplus p_4 = 0 \rightarrow p_4 = 1$$

$$p_4 \oplus i_8 \oplus i_{10} \oplus p_{11} \oplus i_6 = 0 \rightarrow 1 \oplus 1 \oplus 1 \oplus p_{11} \oplus 0 = 0 \rightarrow p_{11} = 1$$

$$p_{11} \oplus i_6 \oplus p_5 \oplus i_{11} \oplus i_1 = 0 \rightarrow 1 \oplus 0 \oplus p_5 \oplus 0 \oplus 1 = 0 \rightarrow p_5 = 0$$

$$i_{11} \oplus i_1 \oplus i_5 \oplus i_3 \oplus p_6 = 0 \rightarrow 0 \oplus 1 \oplus 1 \oplus 0 \oplus p_6 = 0 \rightarrow p_6 = 0$$

$$p_6 \oplus p_{10} \oplus i_2 \oplus p_{12} \oplus i_{10} = 0 \rightarrow 0 \oplus 1 \oplus 0 \oplus p_{12} \oplus 1 = 0 \rightarrow p_{12} = 0$$

$$p_{12} \oplus i_{10} \oplus p_7 \oplus i_1 \oplus i_7 = 0 \rightarrow 0 \oplus 1 \oplus p_7 \oplus 1 \oplus 1 = 0 \rightarrow p_7 = 1$$

$$i_1 \oplus i_7 \oplus p_{11} \oplus i_{13} \oplus p_8 = 0 \rightarrow 1 \oplus 1 \oplus 1 \oplus 1 \oplus p_8 = 0 \rightarrow p_8 = 0$$

$$p_8 \oplus p_{12} \oplus i_9 \oplus p_{13} \oplus p_6 = 0 \rightarrow 0 \oplus 0 \oplus 0 \oplus p_{13} \oplus 0 = 0 \rightarrow p_{13} = 0$$

$$p_{13} \oplus p_6 \oplus p_9 \oplus p_0 = 0 \rightarrow 0 \oplus 0 \oplus p_9 \oplus 0 = 0 \rightarrow p_9 = 0$$

After processing all equations, the parity bits values have been recovered and the encoding procedure has been completed successfully. Any information message can be efficiently encoded using the exact same method. Advantageously, there's no H matrix to be memorised and no inversion matrix to be calculated. The equations to be solved are very simple. Thus, an encoding method according to the invention provide an error correction encoding technique that is simpler to implement than prior art codes, especially turbo-code or LDPC type codes.

A second example is relative to family-E TLDPC. What differ from family-A are the number and position of degree one sections along the trellis. Since the number of degree one section is identical with the number of degree one bits, the number and position of degree one bits change too.

There are r trellis sections with indexes i={0, 1, . . . , r−1}. All sections carry two bits except those sections whose index i satisfies i(mod 5)=0 which carry one bit. The optimum degree distribution profile for rate ⅓ codes is approximately:

$$\Lambda(x) = 0.5x + 0.181x^2 + 0.198^8 + 0.121x^9.$$

FIGS. 16-19 illustrate an example of constructing and encoding a family-E TLDPC code of block length n=24. Since the code rate is ⅓, there will be eight information bits and sixteen parity bits, hence sixteen parity check equations. For Family-E codes, the number of trellis sections is twice the number of parity bits. Hence the trellis will have thirty two sections, of which seven will be degree one sections: the sections i=0; 5; 10 . . . where i(mod 5)=0 carry just one bit. The degree distribution $\Lambda(x)$ is approximated by choosing fourteen degree two, one degree three, one degree nine and one degree ten bits.

Figure 16:
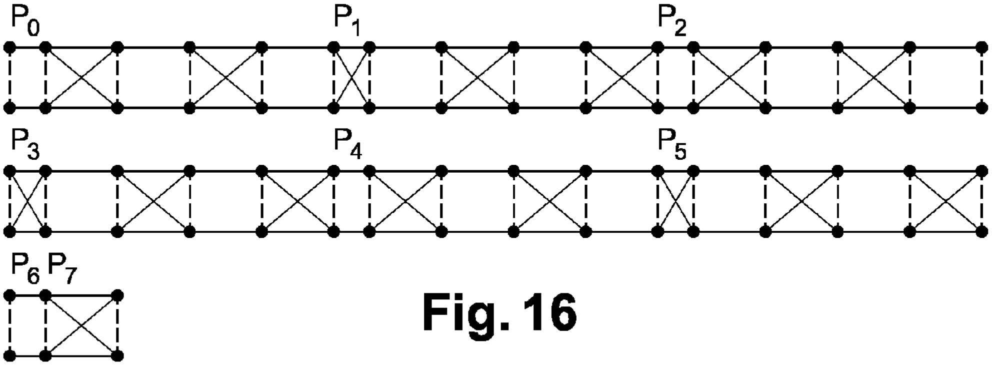
FIGS. 16-19 are complete base code trellis to illustrate an example of constructing and encoding a family-E TLDPC code with bit and section of degree-one and of block length n=24.

The next step is to arrange on the trellis the parity bits and then the information bits. Due to rule 1.1 all degree one sections carry parity bits. Due to rule 1.2 all but one of the parity bits that are accommodated at degree one sections, are degree one bits. The only non-degree one parity bit has in this case degree equal to two, three, nine or ten according to distribution profile. Because it is more advantageous to better protect information bits, the encoding method choose to assign a degree two to this parity bit. This parity bit is randomly chosen to be $p_4$, in this case among $p_2$; $p_3$; $p_4$; $p_5$ because it can't be in proximity to any of the two ends of the trellis (neither of the first or the last two degree one sections) because of rule 1.2. Due to rule 1.3, the remaining degree one bit $p_7$ is accommodated at the last degree two section of the trellis which is illustrated by FIG. 16.

Figure 17:
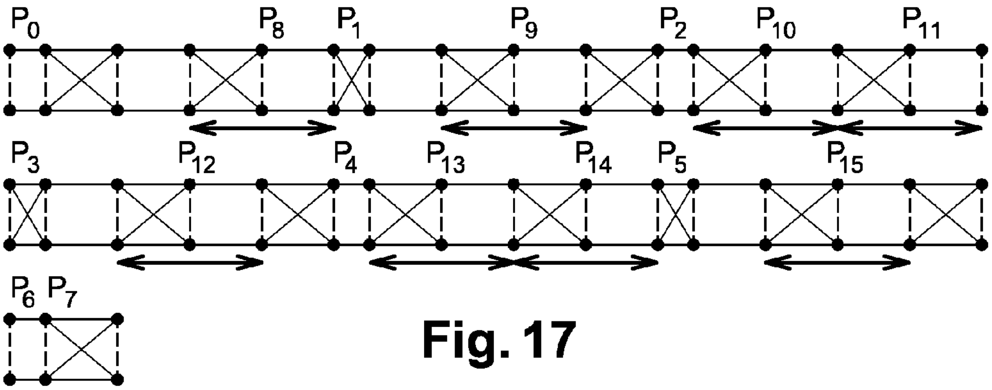

FIG. 17 shows the trellis after the first copies of the remaining parity bits have been placed in such a way that each parity check equation involves only one unknown parity bit at a time. The two-way arrows denote that the corresponding parity bits could be placed in any one of the two neighbouring sections without causing any difference to the encoding procedure.

In contrast to the previous example of the family-A code where the degree distribution was uniform (all non degree one bits were of degree two), in this case the degree distribution profile offers a variety of degrees. Bits of high degree are more protected and are more immune to errors. Thus, the encoding process tend to associate information bits (which are the bits that are wanted to be received error free) with higher degrees and the parity bits with the smaller ones. In this particular case there are fourteen available degree-two bits and sixteen parity bits. Seven out of the sixteen parity bits have been assigned with degree of one and one has been already assigned with degree of two. There are still eight available parity bits and 14−1=13 available degree-two bits to be assigned. Hence, it is possible to assign all remaining parity bits with degree equal to two.

Figure 18:
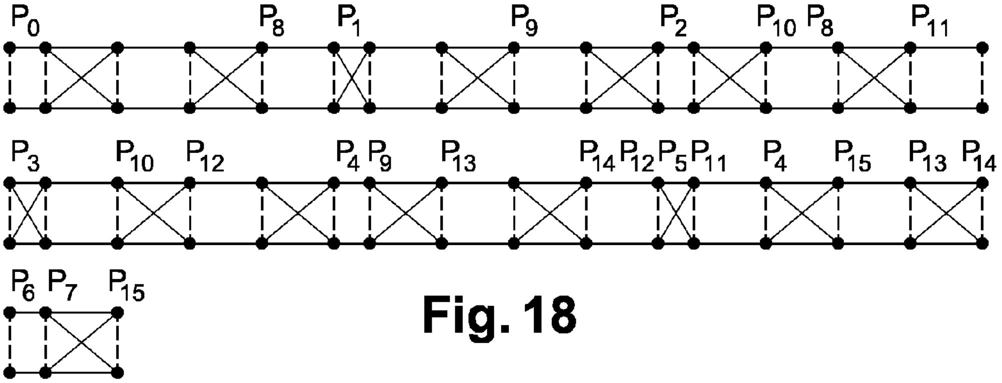

FIG. 18 depicts the trellis after all parity bits have been placed, respecting always the determined permutation rules.

Figure 19:
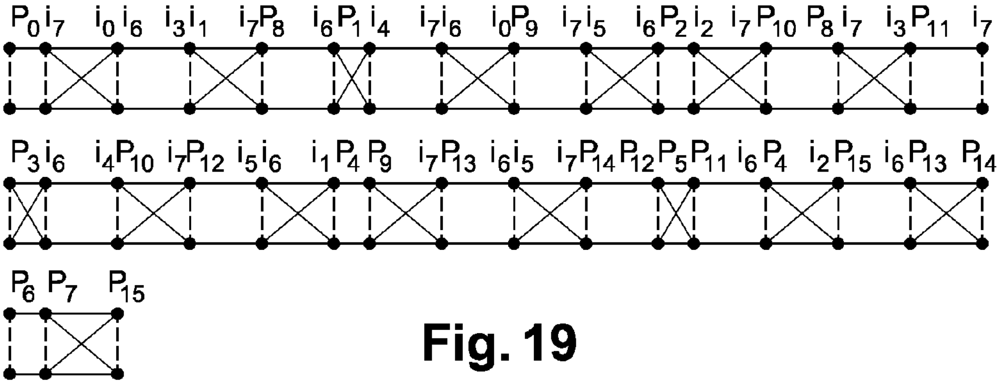

The last trellis of FIG. 19 includes the information bits too and is complete. It is now in proper form for linear encoding.

Next is an example of encoding a given information message $i=\{i_0=0,i_1=0,i_2=1,i_3=0,i_4=1,i_5=1,i_6=0,i_7=0\}$ with respect to the trellis permutation of FIG. 19.

The encoding method starts with the first parity check equation which includes the bits $p_0$; $i_7$; $i_0$; $i_6$; $i_3$ whose expression is the following modulo2 equation:

$$p_0 \oplus i_7 \oplus i_0 \oplus i_6 \oplus i_3 = 0 \quad (6)$$

After substituting the values corresponding to the information bits, the expression of equation (6) becomes:

$$p_0 \oplus 0 \oplus 0 \oplus 0 \oplus 0 = 0 \quad (7)$$

The value of $p_0$ can be recovered from equation (7): $p_0=0$. The same procedure goes on with the second parity check equation for $p_8$.

$$i_6 \oplus i_3 \oplus i_1 \oplus i_7 \oplus p_8 \oplus i_6 = 0 \rightarrow 0 \oplus 0 \oplus 0 \oplus 0 \oplus p_8 \oplus 0 = 0 \rightarrow p_8 = 0$$

The remaining parity bits are recovered similarly:

$$p_8 \oplus i_6 \oplus p_1 \oplus i_4 \oplus i_7 = 0 \rightarrow 0 \oplus 0 \oplus p_1 \oplus 1 \oplus 0 = 0 \rightarrow p_1 = 1$$

$$i_4 \oplus i_7 \oplus i_6 \oplus i_0 \oplus p_9 \oplus i_7 = 0 \rightarrow 1 \oplus 0 \oplus 0 \oplus 0 \oplus p_9 \oplus 0 = 0 \rightarrow p_9 = 1$$

$$p_9 \oplus i_7 \oplus i_5 \oplus i_6 \oplus p_2 = 0 \rightarrow 1 \oplus 0 \oplus 1 \oplus 0 \oplus p_2 = 0 \rightarrow p_2 = 0$$

After processing all equations, the parity bits values have been recovered and the encoding procedure has been completed successfully.

A third example is relative to family-C TLDPC. What differ from family-A and family-E are the number and position of degree one sections along the trellis. Family-C TLDPC codes have more sections and bits of degree-one than family-E, but less than family-A. There are r trellis sections with indexes $i=\{0, 1, \ldots, r-1\}$. All sections carry two bits except those sections whose index i satisfies i(mod 4)=0 which carry one bit. A trellis of a family-C code is different from a trellis of a family-A or family-E code but the encoding method is identical.

In a second embodiment, the encoding method encodes TLDPC codes families without bit or section of degree-one.

In the trellis representation of a parity check equation (FIGS. 7 and 10) a path from section t to section t+2 (where t an even number) exists only if the modulo-2 sum of the participating components is equal to zero. The linear encoding method takes advantage of the following property of modulo-2 operations.

$$a \oplus b \oplus c \oplus d \oplus e \oplus f = 0 \rightarrow a \oplus b \oplus c \oplus d = e \oplus f \quad (8)$$

Because of the tail-biting termination of the base code trellis the last parity check equation $q_{n-k-1}$ involves the last two $T_{(m/2)-2}$, $T_{(m/2)-1}$) and the first $T_0$ trellis sections, where m is the length of the base code. $\pi_i$ represents permutation position (trellis position) i that is accommodated by a bit. The bits are distributed along the base code trellis respecting predetermined permutation rules in such a way that linear encoding is feasible.

Figure 20:
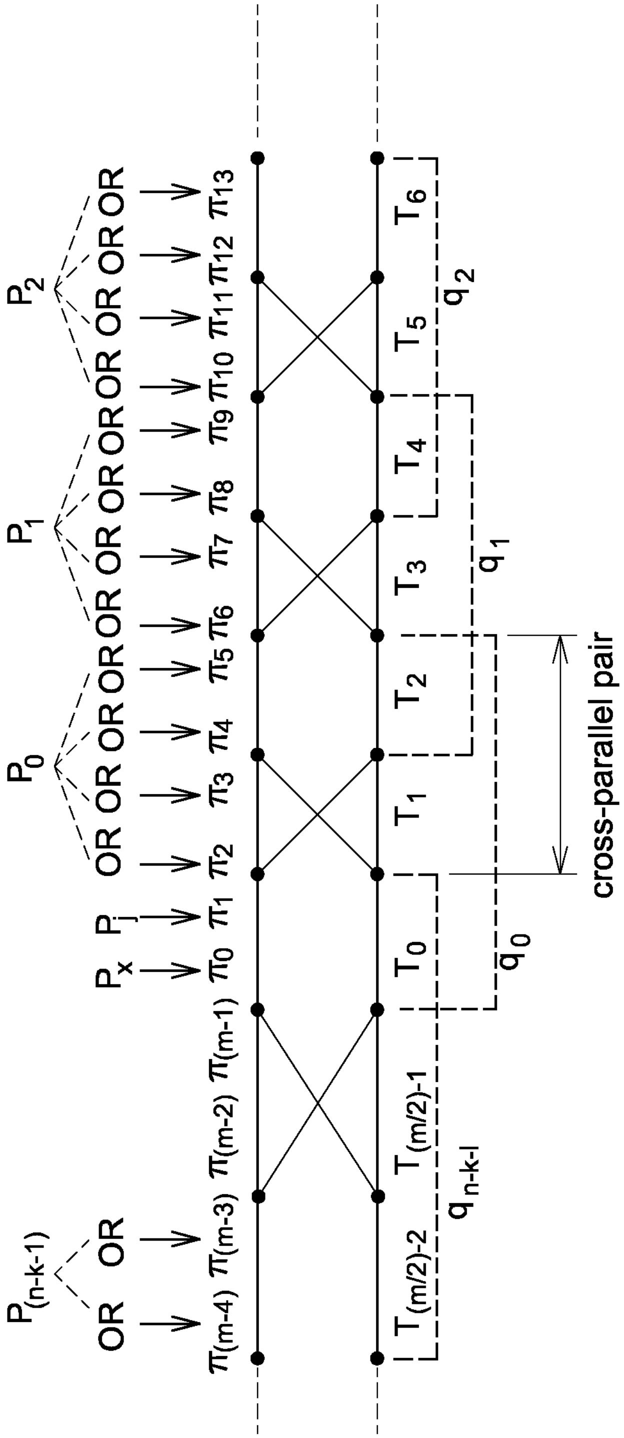
FIG. 20 is a diagram representing part of the beginning and the end of a tail-bite base code trellis.

FIG. 20 represents part of the beginning and of the end of a tail-bite base code trellis. The "OR" labels associated with parity bits $p_i$ denote the available trellis positions where the parity bit can be placed. The determined rules are the following:

rule 2.1: filling both first two positions of the trellis, namely $\pi_0$ and $\pi_1$ with two distinct parity bits ($p_x$ and $p_j$ in FIG. 20).

rule 2.2: associating the first occurrence of each parity bit with pairs of cross parallel sections (cross trellis sections are always at odd indexed sections) as in FIG. 20. Only one unknown can be placed in any of the available positions denoted by the "OR" labels.

- rule 2.2.1: One of the two initial parity bits, either $p_x$ or $p_j$ at positions $\pi_0$ and $\pi_1$ must not participate at this procedure.
- rule 2.2.2: placing the parity bit $p_{(n-k-1)}$ of the last parity check that involves the last two and the first trellis section (due to tail-biting) in one of the two available positions shown in FIG. 20, namely $\pi_{(m-4)}$ or $\pi_{(m-3)}$. Making sure that $p_{(n-k-1)} \neq p_x$ and $p_{n-k-1)} \neq p_j$.

rule 2.3: accommodating one information bit in each of the last two sections of the trellis.

rule 2.4: starting from the last bit, placing along the trellis the replicas of the remaining parity bits with respect to the rule 1.5 described in relation with TLDPC code families with bits of degree one. The parity bit (either $p_x$ or $p_j$) that is excepted due to rule 2.2.1 is also subject to the rule 1.5 but with respect to its neighbour at the first trellis section. That is if $p_x$ is placed at trellis section i, and i(mod 2)=1, then $p_j$ can only be placed at section t>i+1. In case that i(mod 2)=0, $p_j$ can be placed at trellis section t>i.

rule 2.5: filling the empty positions of the trellis with the information bits.

Considering the partition of the base code trellis representing parity check equations, the parity check $q_{(n-k-1)}$ expression is:

$$\pi_{(m-4)}\oplus\pi_{(m-3)}\oplus\pi_{(m-2)}\oplus\pi_{(m-1)}\oplus p_x\oplus p_j=0 \quad (9)$$

and from parity check $q_0$ we get:

$$p_x\oplus p_j\oplus\pi_2\oplus\pi_3\oplus\pi_4\oplus\pi_5=0 \quad (10)$$

Hence, using the property of equation (8) parity check equation $q_{(n-k-1)}$ can be rearranged as:

$$\pi_{(m-4)}\oplus\pi_{(m-3)}\oplus\pi_{(m-2)}\oplus\pi_{(m-1)}=p_x\oplus p_j \quad (11)$$

Substituting in equation (10) for $p_x$ and $p_j$, we get:

$$\pi_{(m-4)}\oplus\pi_{(m-3)}\oplus\pi_{(m-2)}\oplus\pi_{(m-1)}\oplus\pi_2\oplus\pi_3\oplus\pi_4\oplus\pi_5=0 \quad (12)$$

One of the positions $\pi_2$, $\pi_3$, $\pi_4$, $\pi_5$ represents the parity bit $p_0$, and as the only unknown in the equation it can be recovered. The encoding procedure then carries on as in the embodiment for codes with bits of degree one. The only difference is the following. At the beginning of the encoding, the method makes use of the modulo-2 property of equation (8) in order to recover the first parity bit. Equation (11) is the direct outcome of this property. It does not reveal the individual values of the two unknowns $p_x$ and $p_j$, but it gives the method the result of their modulo-2 sum. Rules 2.2 state the necessary condition for ensuring that each parity check has just one unknown. Rule 2.2.1 though, implies that only one of the two parity bits $p_x$ and $p_j$ is recovered by a parity check equation. The other bit is then computed by equation (11).

The two following examples are relative to family-A TLDPC codes without bit or section of degree-one. The examples are provided for each degree distribution profile of family-A. Readily, the degree distribution profile $\Lambda(x)=x$ that yields half-rate codes and the degree distribution profile $\Lambda(x)=0.7x+0.3x^{11}$ that yields codes of rate ⅓.

Figure 21:
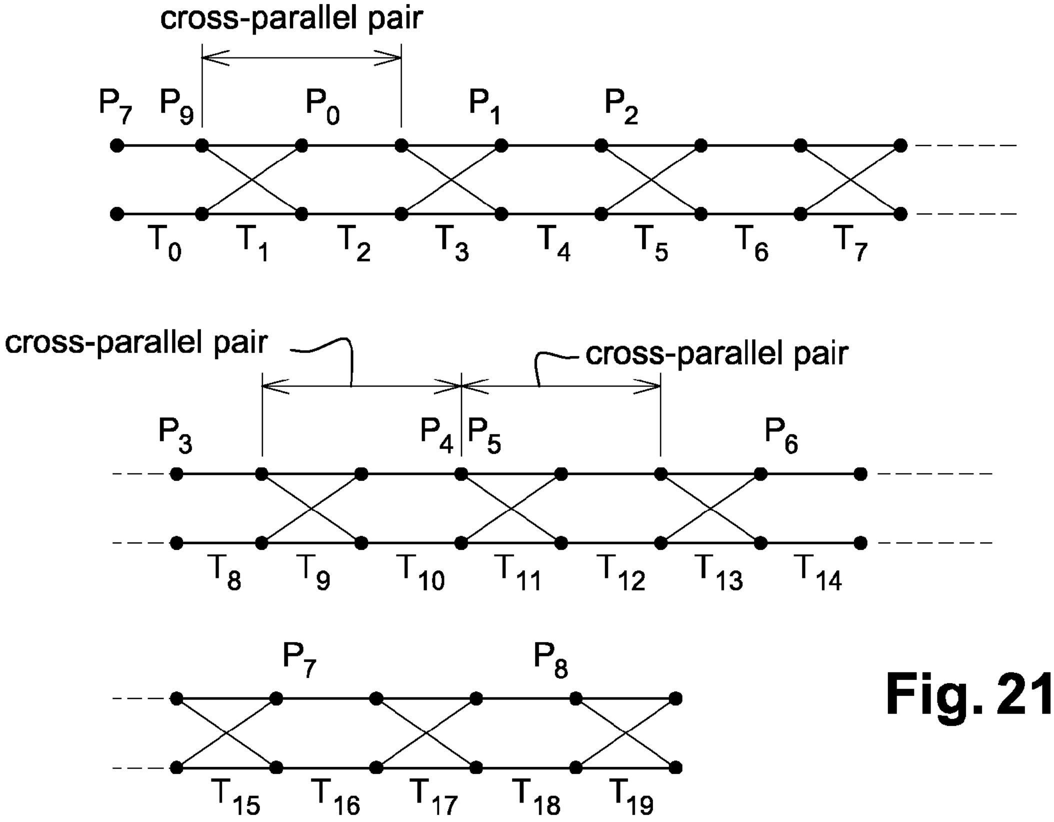
FIGS. 21-23 are complete base code trellis to illustrate an example of constructing and encoding a family-A TLDPC code without bit or section of degree-one, of block length n=20, of base code length m=40 and of degree distribution profile $\Lambda(x)=x$.
Figure 22:
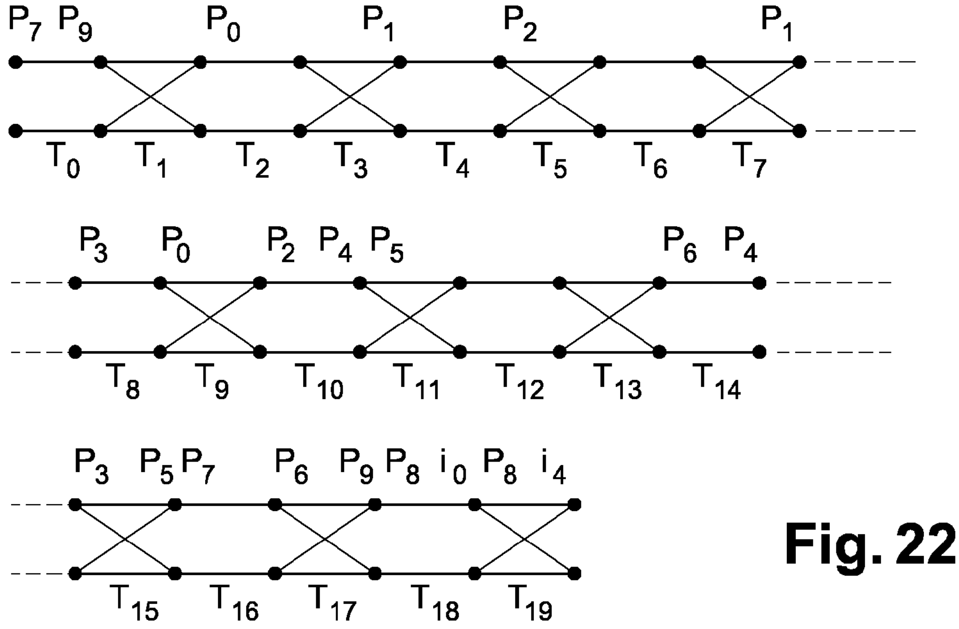
Figure 23:
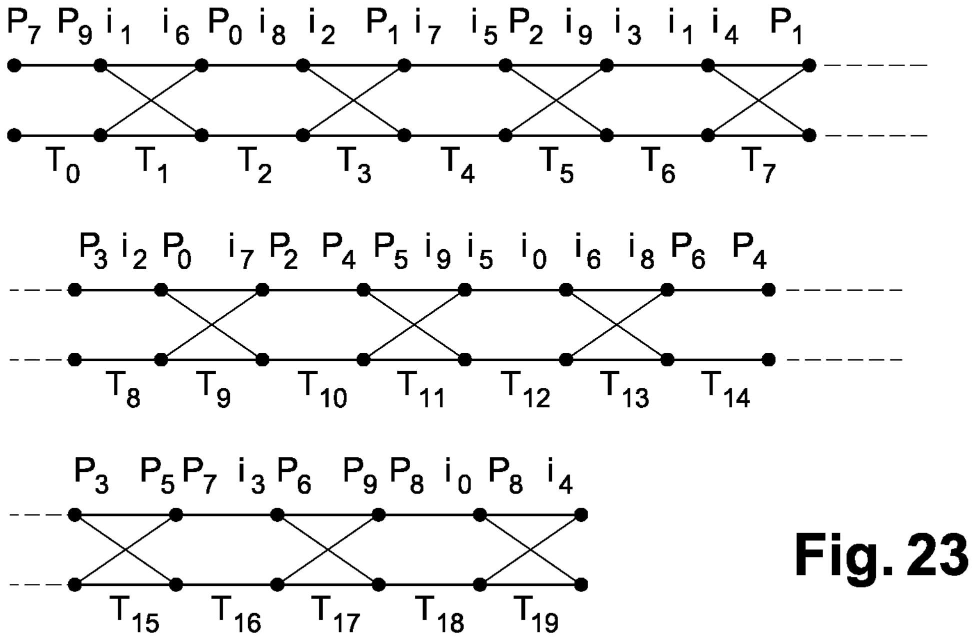

FIGS. 21-23 illustrate an example of constructing and encoding a family-A TLDPC code of block length n=20, base code length m=40 and degree distribution profile $\Lambda(x)=x$.

This is a half rate code so the parity vector $p=\{p_0, p_1, L, p_9\}$ and the information vector $i=\{i_0, i_1, L, i_9\}$ are both of size ten. Starting from the construction of the permutation and the rule 2.1, the method fills the first two positions of the base code trellis with two distinct parity bits. In this example, they have been randomly chosen to be $p_7$ and $p_9$. Obeying the rules 2.2, the method associates a parity bit for each pair of cross-parallel sections. The method selects randomly that only $p_7$ takes part in this procedure and is associated with a parity check (rule 2.2.1). At this stage the permutation looks as in FIG. 21.

Following rule 2.3, the method places one information bit at each of the last two sections of the trellis. The degree distribution profile dictates that all bits have degree equal to two. With the exception of $p_7$, both copies of which have been already accommodated along the trellis, there is one more replica to be placed for each of the remaining parity bits. The positions for the parity replicas must be chosen in a way that rule 1.5 described in relation with the first embodiment is not violated. For $p_9$ the rule 2.4 applies with respect to $p_7$. A permutation example that does not violate the above rules is shown in FIG. 22. The replica of $p_8$ can only be placed at the last trellis section, which means that the last parity check involves $p_8$ twice. This is a key point for the encoding scheme. Finally, the rest of the information bits are added randomly. FIG. 23 illustrates such an addition.

Next is an example of encoding a given information message $i=\{i_0=0, i_1=0, i_2=1, i_3=0, i_4=1, i_5=0, i_6=1, i_7=1, i_8=0, i_9=1\}$ with respect to the trellis permutation of FIG. 23.

The encoding method starts with the last parity check equation $q_9$:

$$p_8\oplus i_0\oplus p_8\oplus i_4\oplus p_7\oplus p_9=0$$

Since it is modulo-2 operation the repeated terms $p_8$ are cancelled out and we get:

$$i_0\oplus i_4\oplus p_7\oplus p_9=0$$

Hence from the modulo-2 property of equation (8) we get:

$$i_0\oplus i_4=p_7\oplus p_9$$

Then the encoding method goes on with the first parity check equation which is combined with trellis sections $T_0$, $T_1$ and $T_2$:

$$p_7\oplus p_9\oplus i_1\oplus i_6\oplus p_0\oplus i_8=0$$

Substituting $p_7\oplus p_9$ with the result obtained previously:

$$i_0\oplus i_4\oplus i_1\oplus i_6\oplus p_0\oplus i_8=0$$

In this last equation, the only unknown is the parity bit $p_0$. By substituting the information values the equation can be solved:

$$0\oplus1\oplus0\oplus1\oplus p_0\oplus0=0\rightarrow p_0=0$$

Then, with the second parity check equation $q_2$:

$$p_0\oplus i_8\oplus i_2\oplus p_1\oplus i_7\oplus i_5=0$$

In this equation, the only unknown is the parity bit $p_1$. By substituting the information and known parity bits value the equation can be solved:

$$0\oplus0\oplus1\oplus p_1\oplus1\oplus0=0\rightarrow p_1=0$$

Then the encoding method goes on successively with the remaining parity checks equations:

$$q_2:\ i_7\oplus i_5\oplus p_2\oplus i_9\oplus i_3\oplus i_1=0\rightarrow p_2=i_7\oplus i_5\oplus i_9\oplus i_3\oplus i_1$$

$$p_2=1\oplus0\oplus1\oplus0\oplus0\rightarrow p_2=0$$

$$q_3:\ i_3\oplus i_1\oplus i_4\oplus p_1\oplus p_3\oplus i_2=0\rightarrow p_3=i_3\oplus i_1\oplus i_4\oplus p_1\oplus i_2$$

$$p_3=0\oplus0\oplus1\oplus0\oplus1\rightarrow p_3=0$$

$$q_4:\ p_3\oplus i_2\oplus p_0\oplus i_7\oplus p_2\oplus p_4=0\rightarrow p_4=p_3\oplus i_2\oplus p_0\oplus i_7\oplus p_2$$

$$p_4=0\oplus1\oplus0\oplus1\oplus0\rightarrow p_4=0$$

$$q_5:\ p_2\oplus p_4\oplus p_5\oplus i_9\oplus i_5\oplus i_0=0\rightarrow p_5=p_2\oplus p_4\oplus i_9\oplus i_5\oplus i_0$$

$$p_5=0\oplus0\oplus1\oplus0\oplus0\rightarrow p_5=1$$

$$q_6:\ i_5\oplus i_0\oplus i_6\oplus i_8\oplus p_6\oplus p_4=0\rightarrow p_6=i_5\oplus i_0\oplus i_6\oplus i_8\oplus p_4$$

$$p_6=0\oplus0\oplus1\oplus0\oplus0\rightarrow p_6=1$$

$$q_7:\ p_6\oplus p_4\oplus p_3\oplus p_5\oplus p_7\oplus i_3=0\rightarrow p_7=p_6\oplus p_4\oplus p_3\oplus p_5\oplus i_3$$

$$p_7=1\oplus0\oplus0\oplus1\oplus0\rightarrow p_7=0$$

At this point, having found the value $p_7$ of one of the two starting parity bits it is straight forward to resolve the value of its neighbour starting parity bit $p_9$ without the use of a parity check, from equation (11):

$$p_8\oplus i_0\oplus p_8\oplus i_4=p_7\oplus p_9$$

The repeated parity bit $p_8$ cancels out:

$$i_0\oplus i_4=p_7\oplus p_9\rightarrow p_9=i_0\oplus i_4\oplus p_7$$

$$p_6=0\oplus1\oplus0\rightarrow p_9=1$$

The parity bit $p_9$ can now be used as a known bit for parity check equation $q_8$:

$$p_7\oplus i_3\oplus p_6\oplus p_9\oplus p_8\oplus i_0=0\rightarrow p_8=p_7\oplus i_3\oplus p_6\oplus p_9\oplus i_0$$

$$p_8=0\oplus 0\oplus 1\oplus 1\oplus 0\rightarrow p_8=0$$

The encoding procedure is completed and the parity vector for the given information message is p={0000011010}

Figure 24:
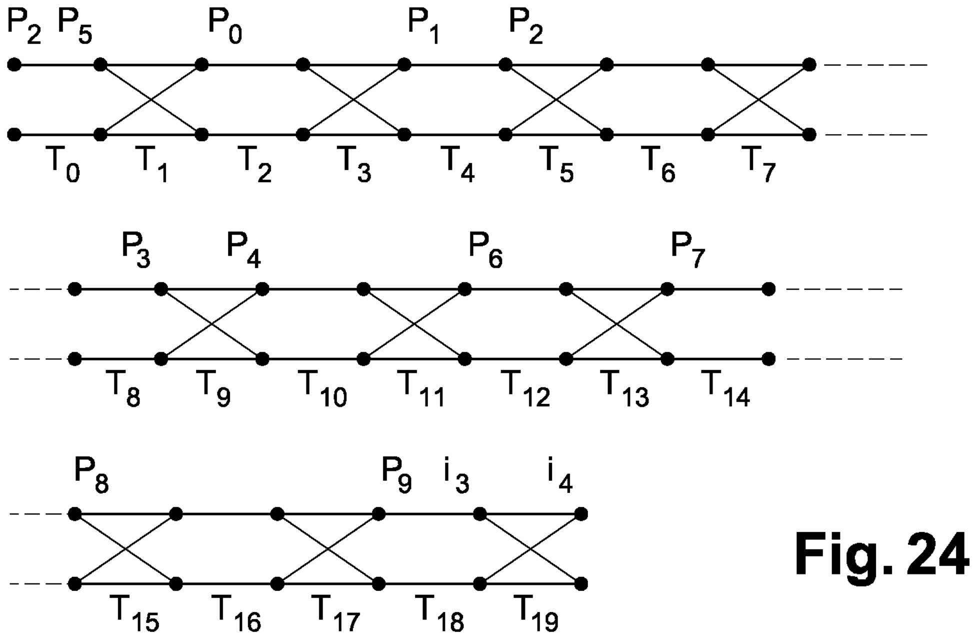
FIGS. 24-26 are complete base code trellis to illustrate an example of constructing and encoding a family-A TLDPC code without bit or section of degree-one, of block length n=15, of k=5 information bits, and of degree distribution profile $\Lambda(x)=0.7x+0.3x^{11}$.
Figure 25:
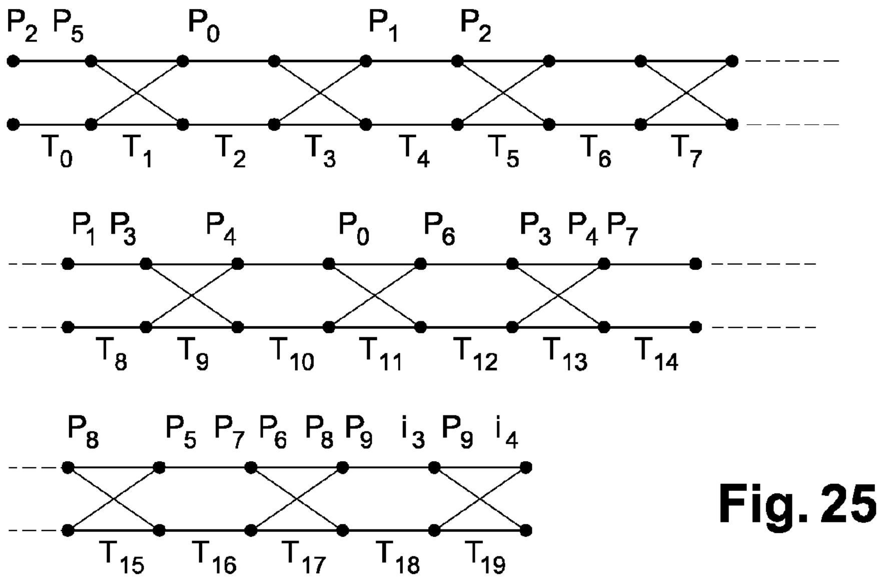
Figure 26:
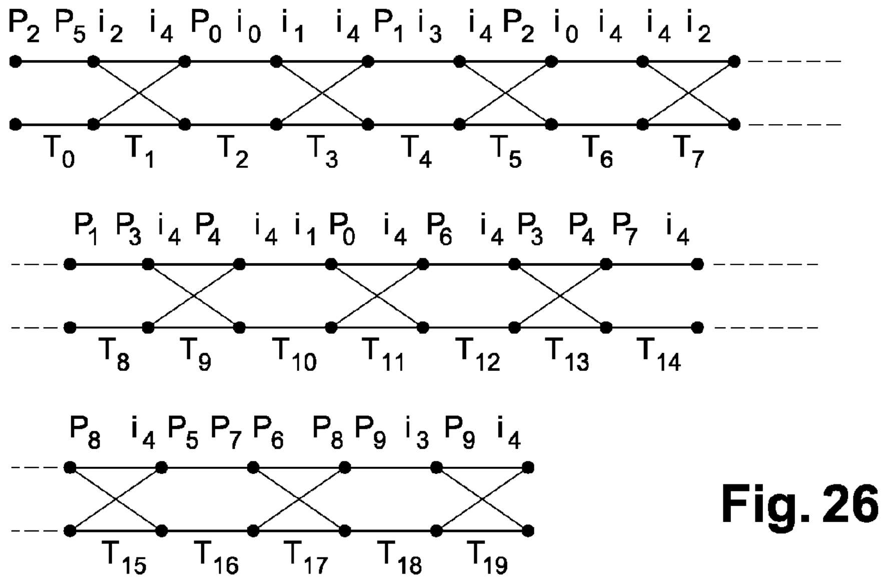

FIGS. 24-26 illustrate an example of constructing and encoding a family-A TLDPC code of block length n=15, k=5 information bits, and degree distribution profile:

$$\Lambda(x)=0.7x+0.3x^{11}$$

All sections are of degree two. Then, the rate code is ⅓, the trellis has twenty sections, twice the number of parity bits, and the base code length is m=40.

Λ(x) expression means that 70% of the total edges are associated with bits of degree two, and 30% with bits of degree twelve. In order to find how many of the n=15 bits will be of degree-two and how many of degree-twelve, the method do the following calculations:

degree two: (0.7×m)/2=14 degree twelve: (0.3×m)/12=1

The method makes sure that the single degree-twelve node is associated with an information bit (e.g. $i_4$) for the benefit of the recovering of the information bits. The rest of the bits are of degree two. The first two positions of the trellis are filled with two distinct randomly chosen parity bits, $p_2$ and $p_5$ for example. One copy of each parity bit (with the exception of $p_5$) is distributed along the trellis, one on each cross-parallel pair. The method makes sure that the last parity bit ($p_9$ in this case) is placed at the last parallel section of the trellis. One information bit is accommodated at each of the last two trellis sections. The trellis permutation up to this point is shown in FIG. 24. The replicas of the parity bits are then placed, without violating rule 1.5. A valid permutation is shown in FIG. 25. The complete permutation is obtained by filling in the information bits as in FIG. 26.

Next is an example of encoding a given information message $i=\{i_0=1, i_1=0, i_2=1, i_3=1, i_4=0\}$ with respect to the trellis permutation of FIG. 26.

Equation (11) gives:

$$p_9\oplus i_3\oplus p_9\oplus i_4\oplus p_2\oplus p_5=0$$

Since it is modulo-2 operation the repeated terms $p_9$ are cancelled out and we get:

$$i_3\oplus i_4\oplus p_2\oplus p_5=0$$

Hence from the modulo-2 property of equation (8) we get:

$$i_3\oplus i_4=p_2\oplus p_5$$

Then the encoding method goes on with the first parity check equation $q_0$ which is combined with trellis sections $T_0$, $T_1$ and $T_2$:

$$p_2\oplus p_5\oplus i_2\oplus i_4\oplus p_0\oplus i_0=0$$

Substituting $p_2\oplus p_5$ with the result obtained previously:

$$i_3\oplus i_4\oplus i_2\oplus i_4\oplus p_0\oplus i_0=0$$

In this last equation, the only unknown is the parity bit $p_0$. By substituting the information values the equation can be solved:

$$1\oplus 0\oplus 1\oplus 0\oplus p_0\oplus 1=0\rightarrow p_0=1$$

Then, with the second parity check equation $q_1$:

$$p_0\oplus i_0\oplus i_1\oplus i_4\oplus p_1\oplus i_3=0$$

In this equation, the only unknown is the parity bit $p_1$. By substituting the information and known parity bit values the equation can be solved:

$$1\oplus 1\oplus 0\oplus 0\oplus p_1\oplus 1=0\rightarrow p_1=1$$

Then the encoding method goes on successively with the remaining parity checks equations:

$$q_2: p_1\oplus i_3\oplus i_4\oplus p_2\oplus i_0\oplus i_4=0\rightarrow p_2=p_1\oplus i_3\oplus i_0$$

$$p_2=1\oplus 1\oplus 1\rightarrow p_2=1$$

At this point, having found the value of one of the two starting parity bits $p_2$ it is straight forward to resolve the value of its neighbour starting parity bit $p_5$ without the use of a parity check, from equation (11):

$$p_9\oplus i_3\oplus p_9\oplus i_4=p_2\oplus p_5$$

The repeated parity bit $p_9$ cancels out:

$$i_3\oplus i_4=p_2\oplus p_5\rightarrow p_5=i_3\oplus i_4\oplus p_2$$

$$p_5=1\oplus 0\oplus 1\rightarrow p_5=0$$

The parity bit $p_5$ can now be used as a known bit for remaining parity check equations:

$$q_3: i_0\oplus i_4\oplus i_4\oplus i_2\oplus p_1\oplus p_3=0\rightarrow p_3=i_0\oplus i_2\oplus p_1$$

$$p_3: 1\oplus 1\oplus 1\rightarrow p_3=1$$

$$q_4: p_1\oplus p_3\oplus i_4\oplus p_4\oplus i_4\oplus i_1=0\rightarrow p_4=p_1\oplus p_3\oplus i_1$$

$$p_4=1\oplus 1\oplus 0\rightarrow p_4=0$$

$$q_5: i_4\oplus i_1\oplus p_0\oplus i_4\oplus p_6\oplus i_4=0\rightarrow p_6=i_4\oplus i_1\oplus p_0$$

$$p_6: 0\oplus 0\oplus 1\rightarrow p_6=1$$

$$q_6: p_6\oplus i_4\oplus p_3\oplus p_4\oplus p_7\oplus i_4=0\rightarrow p_7=p_6\oplus p_3\oplus p_4$$

$$p_7=1\oplus 1\oplus 0\rightarrow p_7=0$$

$$q_7: p_7\oplus i_4\oplus p_8\oplus i_4\oplus p_5\oplus p_7=0\rightarrow p_8=p_5\rightarrow p_8=0$$

$$q_8: p_5\oplus p_7\oplus p_6\oplus p_8\oplus p_9\oplus i_3=0\rightarrow p_9=p_5\oplus p_7\oplus p_6\oplus p_8\oplus i_3$$

$$p_9: 0\oplus 0\oplus 1\oplus 0\oplus 1\rightarrow p_9=0$$

The encoding procedure is completed and the parity vector for the given information message is p={1111001000}.

Figure 27:
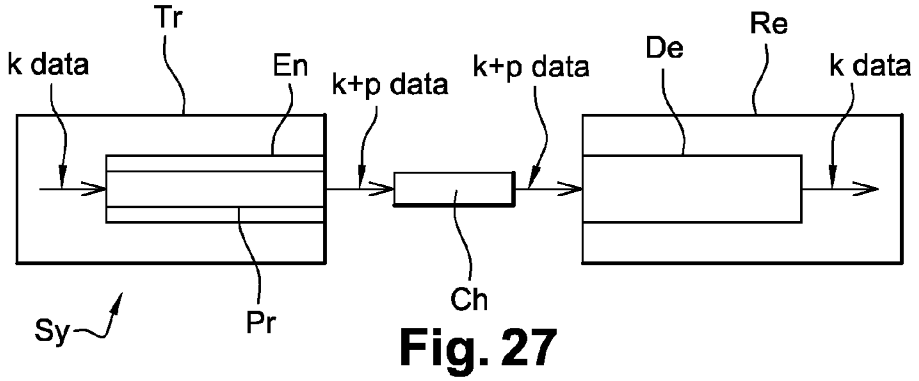
FIG. 27 is a block diagram of a communication system.

A system Sy according to the invention can be represented as in FIG. 27. The system includes a transmitter Tr and a receiver Re. The transmitter Tr sends data over a noisy channel Ch and the receiver Re has the task to identify the transmitted stream. The presence of noise within the channel perturbs the transmitted signal and generates errors. The transmitter includes an encoder for associating p redundancy data with k information data to determine code words with a block length of n=p+k data. The code words are of tail-biting trellis low density parity check type. The encoder implements a degree distribution profile of the n data defining a base code formed of repetitions of the data whose number is determined by the data degree. The base code is represented by a two-states trellis formed of sections with positions whose number depends on a degree section and which are filled with data of the base code. The encoder includes calculation means Pr for:

making a partition of the base code trellis into p intersecting regular parts of triple sections representing p parity check equations, arranging the base code data into the position along the two-states trellis respecting the degree of the sections and of the data as well as pre-determined permutation rules, recovering successively the values of all unknown redundancy data, part after part, using a redundancy data as a known data after being recovered from previous parts.

The Receiver Rr includes a decoder De to decode received data and recover the k information data.

A further object of the invention is an article of manufacture for use in a computer system including calculation means, having a computer usable medium. The article performs an encoding method according to the invention. The computer usable medium includes a computer readable code means for causing:

making a partition, with the calculation means, of the base code trellis into p intersecting regular parts of triple sections representing p parity check equations, arranging, with the calculation means, the base code data into the position along the two-states trellis respecting the degree of the sections and of the data as well as pre-determined permutation rules, recovering successively, with the calculation means, the values of all unknown redundancy data, part after part, using a redundancy data as a known data after being recovered from previous parts.

The general communication system can be implemented by means of a computer system.

The invention claimed is:

1. An encoding method associating p redundancy data bits with k information data bits to determine code words with a block length of n=p+k data bits, the code words being of tail-biting trellis low density parity check type, said method comprising the steps:

- implementing a degree distribution profile of n data bits defining a base code word comprising multiple replicas of the n data bits with respect to the degree distribution, the base code word being represented by a two-state trellis formed of sections with positions accommodating data bits of the base code word whereby the number of positions of a section is denoted as the degree of the section,
- making a partition of the base code word trellis into p intersecting regular parts of triple sections representing p parity check equations,
- arranging the base code word data bits into the positions of the two-state trellis with respect to the degree of the sections and of the data bits as well as pre-determined permutation rules,
- successively recovering the values of all unknown redundancy data bits, one regular part of triple section after another, using a redundancy data bit value as a known value after being recovered from previous regular parts of triple sections.

2. The method according to claim 1, wherein a degree distribution profile comprises different degrees and the different degrees of the distribution profile are assigned successively, first to the redundancy data bits and then to the information data bits, starting with the lowest degree.

3. The method according to claim 1, wherein the permutation rules specify that, for all successive parts, there is, at most, one unknown redundancy data bit value when a redundancy data bit value is a known data bit value if recovered from a previous regular part of triple section.

4. The method according to claim 3, wherein some sections are of degree one, all the sections except the ones of degree one being of degree two, wherein the degree distribution profile of the n data bits is such that a number $\lambda_1$ of degree one data bits is equal to the number of degree one sections, wherein said pre-determined permutation rules are the following:

- all but one degree one sections of the trellis are filled with redundancy data bits and the remaining unfilled degree one section cannot be any of the first or the last two degree one sections of the trellis,
- the remaining unfilled degree one section is filled with a degree two redundancy data bit value,
- all sections of degree two or more are filled with data bits of degree two or more except of a single position at a last degree two section that is filled with the remaining degree one data bit value,
- each of the n-k trellis triple sections that represent parity check equations involve just one unknown data bit value,
- if the first copy of a redundancy data bit value of degree higher than one is placed on a trellis section i where i(mod 2)=0, then its one or more replicas are placed on one or more trellis sections j>i, otherwise if i(mod 2)=1 then the one or more replicas are placed at one or more trellis sections j>(i+1).

5. The method according to claim 1, wherein one permutation rule specifies that, for all successive regular parts of triple sections, a redundancy data bit value is a known data bit value if recovered from a previous regular part and there is at most, one unknown redundancy data bit value arranged at one position of the last two sections of the regular part, except for the last regular part wherein the unknown data bit value is arranged at one position of the first section, and wherein for a first regular part the method uses a tail-biting termination of the base code trellis to determine modulo-two summation of two other unknown distinct redundancy data bits arranged at the first section of the first regular part.

6. The method according to claim 5, wherein all sections are degree two, wherein said pre-determined permutation rules further comprise the following:

- the first occurrence of each redundancy data bit value is associated with the last two sections of the regular parts and these last two sections are associated with only one unknown,
- all sections of degree two or more are filled with data bits of degree two or more except of a single position at the last degree two section that is filled with the remaining degree one data bit value,
- each of the n-k trellis triple sections that represent parity check equations involve just one unknown data bit value,
- if the first copy of a redundancy data bit value of degree higher than one is placed on the trellis section i where i(mod 2)=0, then its one or more replicas are placed on one or more trellis sections j>i, otherwise if i(mod 2)=1 then the one or more replicas are placed at one or more trellis sections j>(i+1).

7. A non-transitory article of manufacture for use in a computer system comprising calculation means, having a computer usable medium, to perform an encoding method for associating p redundancy data bits with k information data bits to determine code words with a block length of n=p+k data bits, the code words being of tail-biting trellis low density parity check type, the encoding method implementing a degree distribution profile of the n data bits defining a base code word including multiple replicas of the n data bits with respect to the degree distribution, the base code word being represented by a two-state trellis formed of sections with positions accommodating data bits of the base code word whereby the number of positions of a section is denoted as the degree of the section, wherein the computer usable medium comprises a computer readable code means for:

- making a partition, with the calculation means, of the base code word trellis into p intersecting regular parts of triple sections representing p parity check equations, arranging, with the calculation means, the base code word data bits into the positions of the two-states trellis with respect to the degree of the sections and of the data bits as well as pre-determined permutation rules, successively recovering, with the calculation means, the values of all unknown redundancy data bits, one regular part of triple section after the other, using a redundancy data bit value as a known value after being recovered from previous regular parts of triple sections.

8. A module on an encoder device for encoding code words associating p redundancy data bits with k information data bits to determine the code words with a block length of n=p+k data bits, the code words being of tail-biting trellis low density parity check type, said module comprising:

a calculating computer encoder chip, a module for implementing a degree distribution profile of n data bits defining a base code word comprising multiple replicas of the n data bits with respect to the degree distribution, the base code word being represented by a two-state trellis formed of sections with positions accommodating data bits of the base code word whereby the number of positions of a section is denoted as the degree of the section, a module for making a partition of the base code word trellis into p intersecting regular parts of triple sections representing p parity check equations, a module for arranging the base code word data bits into the positions of the two-state trellis with respect to the degree of the sections and of the data bits as well as pre-determined permutation rules, a module for successively recovering the values of all unknown redundancy data bits, one regular part of triple section after another, using a redundancy data bit value as a known value after being recovered from previous regular parts of triple sections.

9. An encoding device comprising at least one module for encoding code words according to claim 8.

10. A transmitter comprising an encoding device according to claim 9.

11. A telecommunication system comprising a transmitter according to claim 10.

* * * * *